(12) United States Patent
Huang et al.

(10) Patent No.: US 10,980,139 B2
(45) Date of Patent: Apr. 13, 2021

(54) FLEXIBLE DISPLAY DEVICE

(71) Applicant: Wuhan China Star Optoelectronics Technology Co., Ltd., Wuhan (CN)

(72) Inventors: Yaoli Huang, Wuhan (CN); Xinglong He, Wuhan (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 228 days.

(21) Appl. No.: 16/317,826

(22) PCT Filed: Feb. 26, 2018

(86) PCT No.: PCT/CN2018/077279
§ 371 (c)(1),
(2) Date: Jan. 15, 2019

(87) PCT Pub. No.: WO2019/144461
PCT Pub. Date: Aug. 1, 2019

(65) Prior Publication Data
US 2020/0359513 A1    Nov. 12, 2020

(30) Foreign Application Priority Data

Jan. 26, 2018  (CN) .......................... 201810079697.4

(51) Int. Cl.
*H05K 7/02* (2006.01)
*H05K 7/04* (2006.01)
(Continued)

(52) U.S. Cl.
CPC ......... *H05K 5/0217* (2013.01); *H05K 5/0017* (2013.01)

(58) Field of Classification Search
CPC combination set(s) only.
See application file for complete search history.

(56) References Cited

U.S. PATENT DOCUMENTS

| 2014/0132488 A1 | 5/2014 | Kim et al. |
| 2015/0138072 A1* | 5/2015 | Yamazaki ............. G06F 1/1652 345/156 |

(Continued)

FOREIGN PATENT DOCUMENTS

| CN | 103810945 A | 5/2014 |
| CN | 105513501 A | 4/2016 |

(Continued)

*Primary Examiner* — Hung S. Bui
(74) *Attorney, Agent, or Firm* — Leong C. Lei

(57) ABSTRACT

A display device comprises a backlight module, a display panel and a first glue layer. The backlight module comprises a light guiding plate, a flexible reflecting sheet and a light source. The light guiding plate is provided with a light incoming face, a light outgoing face, a back face and a plurality of side faces. The flexible reflecting sheet is provided with a first area segment and a plurality of second area segments. The back face of the light guiding plate leans against the first area segment; the second area segments are connected to the first area segment and are bent relative to the first area segment; and at least part of the second area segments cover the side faces of the light guiding plate correspondingly. The light source is arranged on the flexible reflecting sheet and is aligned with the light incoming face of the light guiding plate. The light outgoing face faces the display panel. The display panel and the backlight module adhere to each other through the first glue layer. The first glue layer is located between the display panel and the second area segments of the flexible reflecting sheet. The invention also discloses an assembling method of the display device. Thus, the display device can achieve the frame narrowing function.

12 Claims, 4 Drawing Sheets

(51) Int. Cl.
*H05K 5/02* (2006.01)
*H05K 5/00* (2006.01)

(56) References Cited

U.S. PATENT DOCUMENTS

2018/0330696 A1\* 11/2018 Cui ....................... G06F 3/1446
2019/0140200 A1\* 5/2019 Lee ..................... H01L 51/0097

FOREIGN PATENT DOCUMENTS

| CN | 205510119 U | 8/2016 |
| CN | 105976718 A | 9/2016 |
| CN | 106504645 A | 3/2017 |
| CN | 106565781 A | 4/2017 |
| CN | 106764639 A | 5/2017 |

\* cited by examiner

FLEXIBLE DISPLAY DEVICE

FIELD OF THE INVENTION

The present invention relates to a flexible display field, and more particularly to a flexible display device.

BACKGROUND OF THE INVENTION

With the development of display technology, flat display devices such as liquid crystal displays (LCDs) and organic light emitting diode displays (OLEDs) have advantages of high image quality, power saving, thin body, and wide application range to have gradually replaced cathode ray tube (CRT) displays and are widely used in various consumer electronic products, such as mobile phones, televisions, personal digital assistants, digital cameras, notebook computers, and desktop computers to become the major display devices.

Most of the liquid crystal displays on the present market are backlight type liquid crystal displays, which comprise a liquid crystal display panel and a backlight module. The working principle of the liquid crystal display panel is that the Liquid Crystal is injected between the Thin Film Transistor Array Substrate (TFT array substrate) and the Color Filter (CF) substrate. The light of backlight module is refracted to generate images by applying driving voltages to the two substrates for controlling the rotations of the liquid crystal molecules.

Compared with the LCD display panels, the OLED display panel possesses advantages of being thinner, lighter, active lighting, continuous adjustable light color, low cost, fast response, low power consumption, low driving voltage, wide usage temperature range, simple production process and high illuminating efficiency and possible flexible display, and therefore is considered as "dream display". The OLED display panel can be categorized into two major types according to the driving methods, which are the Passive Matrix (PM) type OLED and the Active Matrix (AM) type OLED, i.e. the direct addressing and the Thin Film Transistor (TFT) matrix addressing.

With the continuous improvement of display technology, the side frame of the LCD is getting narrower and narrower. The LCD side frame includes the fixture part and the black matrix. The fixture part is generally composed of a metal frame for acting the fixing function. The black matrix is used to block the edges of the LCD display to prevent the light leakage. Therefore, being completely frameless cannot be achieved. In addition, the scanning circuit of the AMOLED is disposed on the left side frame and right side frame in the front surface of the display to occupy a certain space, thus affecting the large-screen high-definition design of the display structure for now. Due to the array structure of the scanning circuit, it leads to a wider frame of the display but the customer's demand for a narrower frame, such as a mobile phone becomes higher and higher. Therefore, it is urgent to propose a frameless display structure for meeting the development trend of display screens.

SUMMARY OF THE INVENTION

An objective of the present invention is to provide a flexible display device, which can realize the side display of the flexible display device, and can hide the first side frame and the second side frame behind the rear surface of the flexible display device to realize a frameless flexible display device.

For realizing the aforesaid objective, the present invention provides a flexible display device, comprising: a display area and a non display area surrounding the display area; wherein the display area comprises a main display area on a front surface of the flexible display device, and a first side display area and a second side display area on a left side and a right side of the flexible display device; wherein the non display area comprises a first side frame and a second side frame on a rear surface of the flexible display device.

Optionally, before folding the flexible display device, the main display area is in a middle area of the display area, the first side display area and the second side display area are respectively at a left side and a right side of the main display area, the first side frame is at left of the first side display area, the second side frame is at right of the second side display area; the display area comprises a first bending line between the main display area and the first side display area, a first bending line between the main display area and the second side display area, a second bending line between the first side display area and the first side frame and a second bending line between the second side display area and the second side frame.

As folding the flexible display device, the first side display area and the first side frame are folded toward the rear surface of the flexible display device along the first bending line and the second side display area and the second side frame are folded toward the rear surface of the flexible display device along the first bending line, and then the first side frame and the second side frame are folded toward the rear surface of the flexible display device along the second bending lines.

Both an included angle between the main display area and the first side display area and an included angle between the main display area and the second side display area are 90 degrees; both an included angle between the first side display area and the first side frame and an included angle between the second side display area and the second side frame are 90 degrees.

Optionally, the display area further comprises a first rear display area and a second rear display area on the rear surface of the flexible display device; the first side frame is between the main display area and the first rear display area and the second side frame is between the main display area and the second rear display area.

Optionally, before folding the flexible display device, the main display area is in a middle area of the display area, the first side display area and the second side display area are respectively at a left side and a right side of the main display area, the first rear display area is at left of the first side display area, the second rear display area is at right of the second side display area, the first side frame is at left of the first rear display area, the second side frame is at right of the second rear display area; the display area comprises a first bending line between the main display area and the first side display area, a first bending line between the main display area and the second side display area, a second bending line between the first side display area and the first rear display area, a second bending line between the second side display area and the second rear display area, a third bending line between the first rear display area and the first side frame and a third bending line between the second rear display area and the second side frame.

As folding the flexible display device, the first side display area, the first rear display area and the first side frame are folded toward the rear surface of the flexible display device along the first bending line and the second side display area, the second rear display area and the second side frame are folded toward the rear surface of the flexible display device along the first bending line, the first rear display area and the first side frame are folded toward the rear surface of the flexible display device along the second bending line, the second rear display area and the second side frame are folded toward the rear surface of the flexible display device along the second bending line, and then the first side frame and the second side frame are folded toward the rear surface of the flexible display device along the third bending lines.

Both an included angle between the main display area and the first side display area and an included angle between the main display area and the second side display area are 90 degrees; both an included angle between the first side display area and the first rear display area and an included angle between the second side display area and the second rear display area are 90 degrees; both an included angle between the first rear display area and the first side frame and an included angle between the second rear display area and the second side frame are 0 degree.

A width of the first rear display area is equal to a width of the second rear display area; a width of the main display area is twice of the width of the first rear display area.

The flexible display device further comprises a three dimensional glass cover plate covering the display area, wherein the three dimensional glass cover plate is bonded to the flexible display device with optical clear adhesive or optical clear resin; a width of the first side display area is equal to a width of the second side display area; wherein the non display area further comprises an integrated circuit located on the front surface of the flexible display device.

The present invention further comprises a flexible display device, comprising: a display area and a non display area surrounding the display area; wherein the display area comprises a main display area on a front surface of the flexible display device, and a first side display area and a second side display area on a left side and a right side of the flexible display device; wherein the non display area comprises a first side frame and a second side frame on a rear surface of the flexible display device.

wherein the display area further comprises a first rear display area and a second rear display area on the rear surface of the flexible display device; the first side frame is between the main display area and the first rear display area and the second side frame is between the main display area and the second rear display area;

wherein before folding, the main display area is in a middle area of the display area, the first side display area and the second side display area are respectively at a left side and a right side of the main display area, the first rear display area is at left of the first side display area, the second rear display area is at right of the second side display area, the first side frame is at left of the first rear display area, the second side frame is at right of the second rear display area; the display area comprises a first bending line between the main display area and the first side display area, a first bending line between the main display area and the second side display area, a second bending line between the first side display area and the first rear display area, a second bending line between the second side display area and the second rear display area, a third bending line between the first rear display area and the first side frame and a third bending line between the second rear display area and the second side frame;

wherein as folding, the first side display area, the first rear display area and the first side frame are folded toward the rear surface of the flexible display device along the first bending line and the second side display area, the second rear display area and the second side frame are folded toward the rear surface of the flexible display device along the first bending line, the first rear display area and the first side frame are folded toward the rear surface of the flexible display device along the second bending line, the second rear display area and the second side frame are folded toward the rear surface of the flexible display device along the second bending line, and then the first side frame and the second side frame are folded toward the rear surface of the flexible display device along the third bending lines;

wherein both an included angle between the main display area and the first side display area and an included angle between the main display area and the second side display area are 90 degrees; both an included angle between the first side display area and the first rear display area and an included angle between the second side display area and the second rear display area are 90 degrees; both an included angle between the first rear display area and the first side frame and an included angle between the second rear display area and the second side frame are 0 degree.

The benefits of the present invention are: the flexible display device of the present invention comprises: a display area and a non display area surrounding the display area; wherein the display area comprises a main display area on a front surface of the flexible display device, and a first side display area and a second side display area on a left side and a right side of the flexible display device; wherein the non display area comprises a first side frame and a second side frame on a rear surface of the flexible display device. The side display of the flexible display device can be realized and the first side frame and the second side frame can be hidden behind the rear surface of the flexible display device to realize a frameless flexible display device.

BRIEF DESCRIPTION OF THE DRAWINGS

In order to better understand the characteristics and technical aspect of the invention, please refer to the following detailed description and accompanying drawings of the present invention. However, the drawings are provided for reference only and are not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
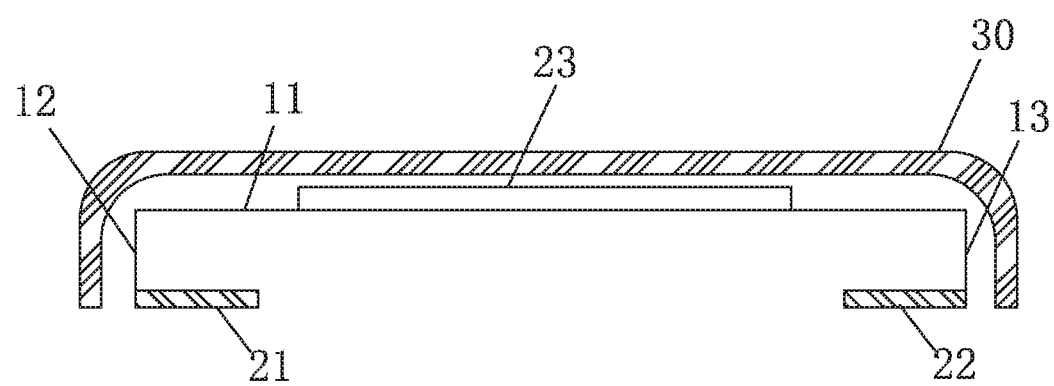
FIG. 1 is a side view diagram of the first embodiment of the flexible display device according to the present invention.
Figure 2:
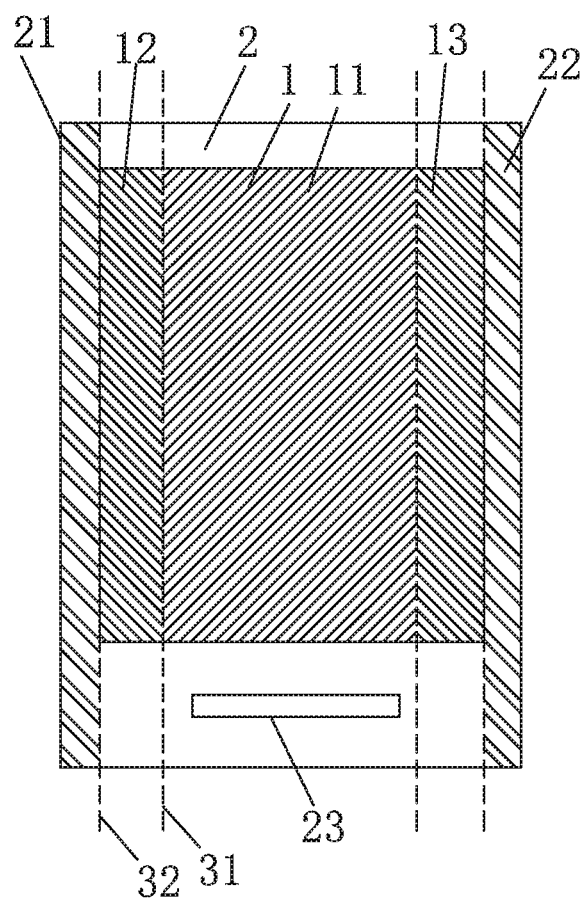
FIG. 2 is an unfolded diagram of the first embodiment of the flexible display device according to the present invention.
Figure 3:
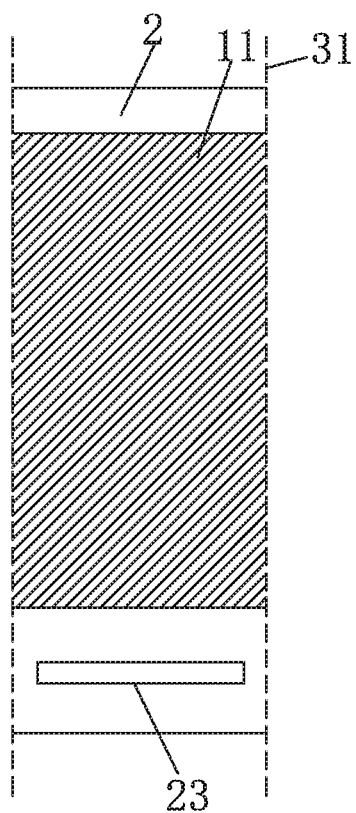
FIG. 3 is a front view diagram of the first embodiment of the flexible display device according to the present invention.

Please refer from FIG. 1 to FIG. 3, which show the first embodiment of the flexible display device according to the present invention. The flexible display device comprises: a display area 1 and a non display area 2 surrounding the display area 1; wherein the display area 1 comprises a main display area 11 on a front surface of the flexible display device, and a first side display area 12 and a second side display area 13 on a left side and a right side of the flexible display device; the non display area 2 comprises a first side frame 21 and a second side frame 22 on a rear surface of the flexible display device.

Specifically, the front surface of the flexible display device is the light exiting surface of the flexible display device.

Specifically, referring to FIG. 2 and FIG. 3, as flattening the flexible display device of the present invention, i.e., before folding the flexible display device, the main display area 11 is in a middle area of the display area 1, the first side display area 12 and the second side display area 13 are respectively at a left side and a right side of the main display area 11, the first side frame 21 is at left of the first side display area 12, the second side frame 22 is at right of the second side display area 13; the display area 1 comprises a first bending line 31 between the main display area 11 and the first side display area 12, a first bending line 31 between the main display area 11 and the second side display area 13, a second bending line 32 between the first side display area 12 and the first side frame 21 and a second bending line 32 between the second side display area 13 and the second side frame 22.

As folding the flexible display device, first, the first side display area 12 and the first side frame 21 are folded toward the rear surface of the flexible display device along the first bending line 31 and the second side display area 13 and the second side frame 22 are folded toward the rear surface of the flexible display device along the first bending line 31 so that the first side display area 12 and the first side frame 21 are at the left surface of the flexible display device and the second side display area 13 and the second side frame 22 are at the right surface of the flexible display device to realize the side display of the flexible display device. Then, the first side frame 21 and the second side frame 22 are folded toward the rear surface of the flexible display device along the second bending lines 32 so that the first side frame 21 and the second side frame 22 are hidden behind the rear surface of the flexible display device. When the user views the flexible display device, the first frame 21 and the second frame 22 cannot be seen to realize a frameless flexible display device.

Preferably, both an included angle between the main display area 11 and the first side display area 12 and an included angle between the main display area 11 and the second side display area 13 are 90 degrees; both an included angle between the first side display area 12 and the first side frame 21 and an included angle between the second side display area 13 and the second side frame 22 are 90 degrees. Namely, as folding the flexible display device, the first side display area 12 and the first side frame 21 are folded toward the rear surface of the flexible display device for 90 degrees along the first bending line 31 and the second side display area 13 and the second side frame 22 are folded toward the rear surface of the flexible display device for 90 degrees along the first bending line 31. The first side frame 21 and the second side frame 22 are folded toward the rear surface of the flexible display device for 90 degrees along the second bending lines 32.

Specifically, a width of the first side display area 12 is equal to a width of the second side display area 13.

Specifically, the non display area 2 further comprises an integrated circuit 23 located on the front surface of the flexible display device.

Specifically, the flexible display device further comprises a three dimensional glass cover plate 30 covering the display area 1, wherein the three dimensional glass cover plate 30 is bonded to the flexible display device with Optically Clear Adhesive (OCA) or Optically Clear Resin (OCR). Since the three dimensional glass cover plate 30 is a glass having an arc over the entire surface, the flexible display device can be well supported and protected.

Figure 4:
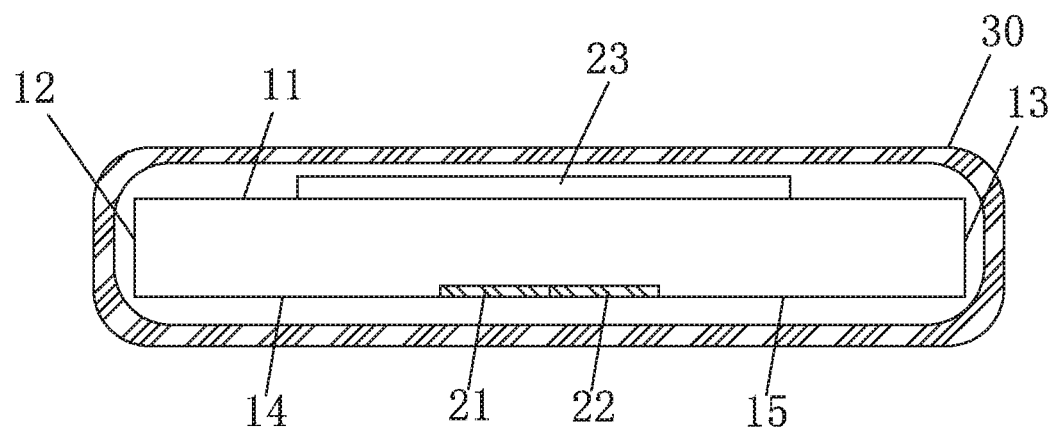
FIG. 4 is a side view diagram of the second embodiment of the flexible display device according to the present invention.

Please refer to FIG. 4, which is the second embodiment of the flexible display device according to the present invention. What differs from the first embodiment is that the display area 1 further comprises: a first rear display area 14 and a second rear display area 15 on the rear surface of the flexible display device; the first side frame 21 is between the main display area 11 and the first rear display area 13 and the second side frame 22 is between the main display area 11 and the second rear display area 15.

Figure 5:
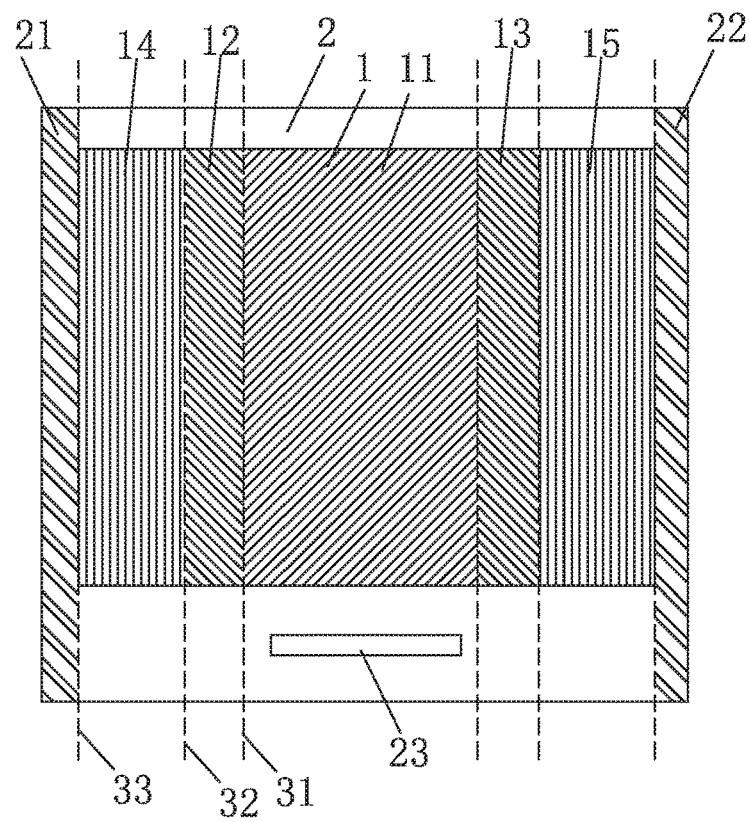
FIG. 5 is an unfolded diagram of the second embodiment of the flexible display device according to the present invention.
Figure 6:
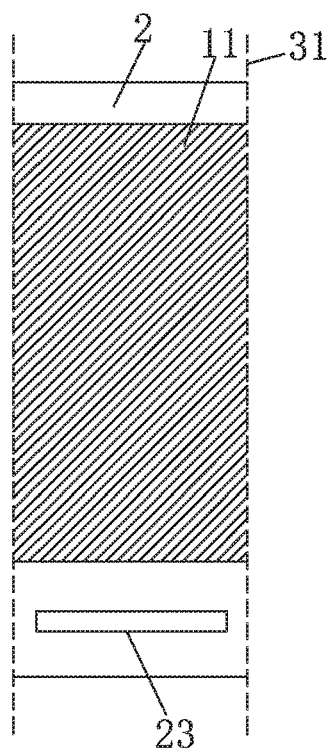
FIG. 6 is a front view diagram of the first embodiment of the flexible display device according to the present invention.

Specifically, referring to FIG. 5 and FIG. 6, as flattening the flexible display device of the present invention, i.e., before folding the flexible display device, the main display area 11 is in a middle area of the display area 1, the first side display area 12 and the second side display area 13 are respectively at a left side and a right side of the main display area 11, the first rear display area 14 is at left of the first side display area 12, the second rear display area 15 is at right of the second side display area 13, the first side frame 21 is at left of the first rear display area 14, the second side frame 22 is at right of the second rear display area 15; the display area 1 comprises a first bending line 31 between the main display area 11 and the first side display area 12, a first bending line between the main display area 11 and the second side display area 13, a second bending line 32 between the first side display area 12 and the first rear display area 14, a second bending line between the second side display area 13 and the second rear display area 15, a third bending line 33 between the first rear display area 14 and the first side frame 21 and a third bending line 33 between the second rear display area 15 and the second side frame 22;

As folding the flexible display device, first, the first side display area 12, the first rear display area 14 and the first side frame 21 are folded toward the rear surface of the flexible display device along the first bending line 31 and the second side display area 13, the second rear display area 15 and the second side frame 22 are folded toward the rear surface of the flexible display device along the first bending line 31 so that the first side display area 12, the first rear display area 14 and the first side frame 21 are at the left surface of the flexible display device and the second side display area 13, the second rear display area 15 and the second side frame 22 are at the right surface of the flexible display device to realize the side display of the flexible display device. Then, the first rear display area 14 and the first side frame 21 are folded toward the rear surface of the flexible display device along the second bending lines 32 and the second rear display area 15 and the second side frame 22 are folded toward the rear surface of the flexible display device along the second bending lines 32. Meanwhile, both the first side frame 21 and the second side frame 22 are folded toward the rear surface of the flexible display device along the third bending lines 33 so that the first rear display area 14 and the second rear display area 15 are located at the rear surface of the flexible display device to realize the rear display of the flexible display device. Moreover, the first side frame 21 is hidden between the main display area 11 and the first rear display area 14 and the second side frame 22 is hidden between the main display area 11 and the second rear display area 15. When the user views the flexible display device, the first frame 21 and the second frame 22 cannot be seen to realize a frameless flexible display device.

Preferably, both an included angle between the main display area 11 and the first side display area 12 and an included angle between the main display area 11 and the second side display area 13 are 90 degrees; both an included angle between the first side display area 12 and the first rear display area 14 and an included angle between the second side display area 13 and the second rear display area 15 are 90 degrees; both an included angle between the first rear display area 14 and the first side frame 21 and an included angle between the second rear display area 15 and the second side frame 22 are 0 degree.

As folding the flexible display device, the first side display area 12, the first rear display area 14 and the first side frame 21 are folded toward the rear surface of the flexible display device for 90 degrees along the first bending line 31 and the second side display area 13, the second rear display area 15 and the second side frame 22 are folded toward the rear surface of the flexible display device for 90 degrees along the first bending line 31, the first rear display area 14 and the first side frame 21 are folded toward the rear surface of the flexible display device for 90 degrees along the second bending line 32, the second rear display area 15 and the second side frame 22 are folded toward the rear surface of the flexible display device for 90 degrees along the second bending line, and then the first side frame 21 and the second side frame 22 are folded toward the rear surface of the flexible display device for 180 degrees along the third bending lines 33.

Specifically, a width of the first rear display area 14 is equal to a width of the second rear display area 15; a width of the main display area 11 is twice of the width of the first rear display area 14. Thus, a sum of the width of the first rear display area 14 and the width of the second rear display area 15 located at the rear surface of the flexible display device is equal to the width of the main display area 11. Namely, the flexible display device of the present invention is a closed ring structure and the three dimensional glass cover plate 30 is also a closed ring structure.

In conclusion, the flexible display device of the present invention comprises: a display area and a non display area surrounding the display area; wherein the display area comprises a main display area on a front surface of the flexible display device, and a first side display area and a second side display area on a left side and a right side of the flexible display device; wherein the non display area comprises a first side frame and a second side frame on a rear surface of the flexible display device. The side display of the flexible display device can be realized and the first side frame and the second side frame can be hidden behind the rear surface of the flexible display device to realize a frameless flexible display device.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A flexible display device, comprising: a display area and a non display area surrounding the display area; wherein the display area comprises a main display area on a front surface of the flexible display device, and a first side display area and a second side display area on a left side and a right side of the flexible display device; wherein the non display area comprises a first side frame and a second side frame on a rear surface of the flexible display device, wherein the display area further comprises a first rear display area and a second rear display area on the rear surface of the flexible display device; the first side frame is between the main display area and the first rear display area so that the first side frame is hidden behind the first rear display area of the flexible display device, and the second side frame is between the main display area and the second rear display area so that the second side frame is hidden behind the second rear display area of the flexible display device, and the first side frame and the second side frame cannot be seen to achieve a frameless flexible display device.

2. The flexible display device according claim 1, wherein before folding, the main display area is in a middle area of the display area, the first side display area and the second side display area are respectively at a left side and a right side of the main display area, the first side frame is at left of the first side display area, the second side frame is at right of the second side display area; the display area comprises a first bending line between the main display area and the first side display area, a first bending line between the main display area and the second side display area, a second bending line between the first side display area and the first side frame and a second bending line between the second side display area and the second side frame.

3. The flexible display device according claim 2, wherein as folding, the first side display area and the first side frame are folded toward the rear surface of the flexible display device along the first bending line and the second side display area and the second side frame are folded toward the rear surface of the flexible display device along the first bending line, and then the first side frame and the second side frame are folded toward the rear surface of the flexible display device along the second bending lines.

4. The flexible display device according claim 1, wherein both an included angle between the main display area and the first side display area and an included angle between the main display area and the second side display area are 90 degrees; both an included angle between the first side display area and the first side frame and an included angle between the second side display area and the second side frame are 90 degrees.

5. The flexible display device according claim 1, wherein before folding, the main display area is in a middle area of the display area, the first side display area and the second side display area are respectively at a left side and a right side of the main display area, the first rear display area is at left of the first side display area, the second rear display area is at right of the second side display area, the first side frame is at left of the first rear display area, the second side frame is at right of the second rear display area; the display area comprises a first bending line between the main display area and the first side display area, a first bending line between the main display area and the second side display area, a second bending line between the first side display area and the first rear display area, a second bending line between the second side display area and the second rear display area, a third bending line between the first rear display area and the first side frame and a third bending line between the second rear display area and the second side frame.

6. The flexible display device according claim 5, wherein as folding, the first side display area, the first rear display area and the first side frame are folded toward the rear surface of the flexible display device along the first bending line so that the first side display area and the first side frame are at a left surface of the flexible display device and the second side display area, the second rear display area and the second side frame are folded toward the rear surface of the flexible display device along the first bending line so that the first side display area and the first side frame are at the left surface of the flexible display device, and then the first rear display area and the first side frame are folded toward the rear surface of the flexible display device along the second bending line, the second rear display area and the second side frame are folded toward the rear surface of the flexible display device along the second bending line, and then the first side frame and the second side frame are folded toward the rear surface of the flexible display device along the third bending lines.

7. The flexible display device according claim 1, wherein both an included angle between the main display area and the first side display area and an included angle between the main display area and the second side display area are 90 degrees; both an included angle between the first side display area and the first rear display area and an included angle between the second side display area and the second rear display area are 90 degrees; both an included angle between the first rear display area and the first side frame and an included angle between the second rear display area and the second side frame are 0 degree.

8. The flexible display device according claim 1, wherein a width of the first rear display area is equal to a width of the second rear display area; a width of the main display area is twice of the width of the first rear display area.

9. The flexible display device according claim 1, further comprising a three dimensional glass cover plate covering the display area, wherein the three dimensional glass cover plate is bonded to the flexible display device with optical clear adhesive or optical clear resin; a width of the first side display area is equal to a width of the second side display area; wherein the non display area further comprises an integrated circuit located on the front surface of the flexible display device.

10. A flexible display device, comprising: a display area and a non display area surrounding the display area; wherein the display area comprises a main display area on a front surface of the flexible display device, and a first side display area and a second side display area on the left side and right side of the flexible display device; wherein the non display area comprises a first side frame and a second side frame on a rear surface of the flexible display device;

wherein the display area further comprises a first rear display area and a second rear display area on the rear surface of the flexible display device; the first side frame is between the main display area and the first rear display area so that the first side frame is hidden behind the first rear display area of the flexible display device, and the second side frame is between the main display area and the second rear display area so that the second side frame is hidden behind the second rear display area of the flexible display device, and the first side frame and the second side frame cannot be seen to achieve a frameless flexible display device;

wherein before folding, the main display area is in a middle area of the display area, the first side display area and the second side display area are respectively at a left side and a right side of the main display area, the first rear display area is at left of the first side display area, the second rear display area is at right of the second side display area, the first side frame is at left of the first rear display area, the second side frame is at right of the second rear display area; the display area comprises a first bending line between the main display area and the first side display area, a first bending line between the main display area and the second side display area, a second bending line between the first side display area and the first rear display area, a second bending line between the second side display area and the second rear display area, a third bending line between the first rear display area and the first side frame and a third bending line between the second rear display area and the second side frame;

wherein as folding, the first side display area, the first rear display area and the first side frame are folded toward the rear surface of the flexible display device along the first bending line so that the first side display area and the first side frame are at a left surface of the flexible display device and the second side display area, the second rear display area and the second side frame are folded toward the rear surface of the flexible display device along the first bending line so that the first side display area and the first side frame are at the left surface of the flexible display device, and then the first rear display area and the first side frame are folded toward the rear surface of the flexible display device along the second bending line, the second rear display area and the second side frame are folded toward the rear surface of the flexible display device along the second bending line, and then the first side frame and the second side frame are folded toward the rear surface of the flexible display device along the third bending lines;

wherein both an included angle between the main display area and the first side display area and an included angle between the main display area and the second side display area are 90 degrees; both an included angle between the first side display area and the first rear display area and an included angle between the second side display area and the second rear display area are 90 degrees; both an included angle between the first rear display area and the first side frame and an included angle between the second rear display area and the second side frame are 0 degree.

11. The flexible display device according claim 10, wherein a width of the first rear display area is equal to a width of the second rear display area; a width of the main display area is twice of the width of the first rear display area.

12. The flexible display device according claim 10, further comprising a three dimensional glass cover plate covering the display area, wherein the three dimensional glass cover plate is bonded to the flexible display device with optical clear adhesive or optical clear resin; a width of the first side display area is equal to a width of the second side display area; wherein the non display area further comprises an integrated circuit located on the front surface of the flexible display device.

* * * * *